(12) United States Patent
Minz et al.

(10) Patent No.: US 8,140,738 B2
(45) Date of Patent: Mar. 20, 2012

(54) FLASH MEMORY INTERFACE DEVICE

(75) Inventors: Deboleena Minz, Ghaziabad (IN); Sanjeev Varshney, Noida (IN)

(73) Assignee: STMicroelectronics Pvt. Ltd., Greater Noida, IN (US)

( * ) Notice: Subject to any disclaimer, the term of this patent is extended or adjusted under 35 U.S.C. 154(b) by 793 days.

(21) Appl. No.: 11/780,441

(22) Filed: Jul. 19, 2007

(65) Prior Publication Data

US 2008/0052448 A1 Feb. 28, 2008

(30) Foreign Application Priority Data

Jul. 20, 2006 (IN) .......................... 1670/DEL/2006

(51) Int. Cl.
*G06F 12/02* (2006.01)
(52) U.S. Cl. ..................... 711/103; 711/105; 711/167
(58) Field of Classification Search .................. None
See application file for complete search history.

(56) References Cited

U.S. PATENT DOCUMENTS

| | | | | |
|---|---|---|---|---|
| 5,907,700 | A * | 5/1999 | Talreja et al. ................ | 713/502 |
| 6,795,906 | B2 * | 9/2004 | Matsuda ........................ | 711/167 |
| 2003/0131185 | A1 * | 7/2003 | Dover ........................... | 711/103 |
| 2004/0003168 | A1 * | 1/2004 | Kim et al. ..................... | 711/103 |
| 2004/0054864 | A1 * | 3/2004 | Jameson ....................... | 711/167 |
| 2004/0098549 | A1 * | 5/2004 | Dorst ............................ | 711/167 |
| 2006/0282608 | A1 * | 12/2006 | Takemae ...................... | 711/101 |

* cited by examiner

*Primary Examiner* — Kaushikkumar Patel
(74) *Attorney, Agent, or Firm* — Gardere Wynne Sewell LLP

(57) ABSTRACT

A memory interface module provides interfacing between a host processor with multiple flash memories and parallel interfaces of varying protocols. The interface module includes multiple register files, multiple operation information registers, an internal memory, a flash interface portion, and a finite state machine (FSM). The register files receive a command from the host processor for controlling an operation of multiple flash memories. The operation information registers execute and store the command and operation information. The internal memory receives and stores host data from the host processor. The internal memory further stores flash data extracted from multiple flash memories. The flash interface portion interacts with the memory devices connected to the controller. The FSM extracts the command and the operation information from the register files, which are programmed by the user and controls the control signals of the memory devices connected to the controller through the flash interface.

11 Claims, 8 Drawing Sheets

| S NO. | SIGNAL NAME | SIGNAL NAME | INTEL | AMD | ST |
|---|---|---|---|---|---|
| 1 | ADDRESS | INPUT | AMAX:AMIN | A0-A19 | A1-A22 |
| 2 | DATA | I/O | D[15:0] | DQ0-DQ31 | DQ0-DQ15 |
| 3 | CHIP ENABLE | INPUT | CE# | CE# | E bar |
| 4 | OUTPUT ENABLE | INPUT | OE# | OE# | G bar |
| 5 | LATCH ENABLE | INPUT | ADV# | ADV# | L bar |
| 6 | WRITE ENABLE | INPUT | WE# | WE# | W bar |
| 7 | CLOCK | INPUT | CLK | CLK | K |
| 8 | READY/BUSY | OPEN DRAIN OUTPUT | STS (STATUS/ READY-BUSY) | RY/BY# | STS (STATUS/ READY-BUSY) |
| 9 | PROG/ERASE ENABLE | INPUT | VPEN (BLOCK LOCK ENABLE TOO) | WP# (SIMILER TO VPEN) | VPEN |
| 10 | END OF BURST | OUTPUT | ....... | IND# | ....... |
| 11 | VALID DATA READY | OUTPUT | WAIT | ....... | R |

FIG.3

| Controller I/Os | NAND ports | NOR ports | SERIAL ports | MPX ports |
|---|---|---|---|---|
| mem_addr[31:0] | OPEN | Address | OPEN | OPEN |
| mem_CSn | CEBar | CEBar | SBar/CEBar | NOT_CS/CEBar |
| mem_OE_ALE_BS | ALE | OEBar | OPEN | BS |
| mem_LBar_CLE_FR | CLE | LBar | OPEN | FR |
| mem_WEBar | WBar | WBar | OPEN | WBar |
| mem_RBar | RBar | OPEN | OPEN | OPEN |
| mem_data_in | DQ | DQ | OPEN | AD |
| mem_data_out | DQ | DQ | OPEN | AD |
| mem_RBn | RBn | RBn | OPEN | RBn |
| mem_Clock | OPEN | CLK | CLK | CLK |
| mem_serial_in | OPEN | OPEN | Q | OPEN |
| mem_serial_out | OPEN | OPEN | D | OPEN |

FIG.8

FLASH MEMORY INTERFACE DEVICE

PRIORITY CLAIM

The present application claims priority from Indian Patent Application No. 1670/Del/2006 of the same title filed Jul. 20, 2006, the disclosure of which is hereby incorporated by reference.

BACKGROUND

1. Technical Field

The present application relates to interface devices, and more specifically, to a flexible and programmable flash memory interface device capable of interfacing with various kinds of flash memory devices with varying protocols.

2. Description of Related Art

Flash memory is a form of EEPROM (Electrically-Erasable Programmable Read-Only Memory) that allows multiple memory locations to be erased or written in one programming operation. It is a Non-Volatile Read Write Memory (NVRWM) commonly used in memory cards, USB flash drives, MP3 players, digital cameras, mobile phones, etc. There are different kinds of flash memory devices available in the market today. The flash memory stores a correctable control program, which is used instead of an auxiliary memory.

NOR-based flash has long erase and write times, but has a full address/data (memory) interface that allows random access to any location, which makes it suitable for storage of program code that needs to be infrequently updated, such as a computer's BIOS or the firmware of a set-top box. The endurance of NOR-based flash is 10,000 to 1,000,000 erase cycles. NOR-based flash was the basis of early flash-based removable media; Compact Flash was originally based on this technology, although later cards moved to the cheaper NAND flash.

NAND flash has faster erase and write times, higher density, and lower cost per bit than NOR flash, and ten times the endurance. However its I/O interface allows only sequential access to data. This makes it suitable for mass-storage devices such as PC cards and various memory cards, and it is somewhat less useful for computer memory.

Serial Flash is a small, low-power flash memory that uses a serial interface for sequential data access. Serial flash uses fewer wires than parallel flash memories to transfer data to and from a system. A reduction in board space, power consumption and system cost are some of the benefits of the lower pin count interface for serial flash memories.

The flash memory is divided into a NAND flash memory and a NOR type flash memory. The NOR type flash memory uses an interface method as an SRAM or as a ROM to easily construct a circuit with a processor. Further, the NAND flash memory is more sophisticated using the interface method than the NOR type flash memory and has an advantage of lower economic costs. However, the NAND flash memory has a higher degree of integration than the NOR flash memory.

These days, a number of vendors are providing NOR, NAND and SERIAL flashes having varying protocols and interfacing programs, and hence no common protocol is being followed by these vendors. The result of these flashes is that every new flash that is brought out in the market has its own set of commands, modes and operations that can be performed on them. This becomes a problem when the memory interface modules interacting with these devices have to be modified for every different device. The IPs (Intellectual Property) in the subsystem is not configurable, thus requiring manual changes depending upon nuances of different chips. Many SOCs (System on Chip) have more than one type of flash memory devices in the subsystem. This entails having more than one memory interface module to interact with them. In order to reduce the pin count of the SOC, the output pins of these multiple modules have to be multiplexed leading to an increase in glue logic, and thus area.

FIG. 1 represents a conventional structure for a flash memory interface system interacting with NAND, NOR and SERIAL flash memories. The interface has three different modules, one for each type of flash memory device. The output pins of these modules are multiplexed at the output of the subsystem, which drives a shared bus. The shared bus in turn drives the pins of the memory blocks. These modules interact with the external world through a decoder or a router that decodes the incoming address bits and routes it to the required module.

The modules offer little or no flexibility to accommodate new protocols, or even new modes. Multiplexing the pins of these three modules adds to the glue logic, and therefore increases a usage area and a delay. Even when the memory devices come up with optimizations in the protocol which offer more efficient access times (for example, removing dummy cycles), incorporating them in the interface subsystem means changing the RTL and going through the entire design cycle which is both time and money consuming.

There is a need of a versatile/flexible solution through a proposed flexible and programmable flash memory interface device, which can overcome the above mentioned problems. Moreover, the proposed memory interface device allows support for maximum features of different memories available in the market for easy integration.

SUMMARY OF THE INVENTION

An embodiment provides a memory interface module having a minimal area due to one set of HW state machines serving for all types of memories with varying protocols.

An embodiment provides a memory interface module, which supports newly designed flash memory types due to highly flexible approach with minor changes in software (SW).

An embodiment provides a memory interface module, which utilizes reduced pin counts for different memory devices.

An embodiment provides a memory interface module, which results in reduced glue, as there would be no need to multiplex the pins for different types of flashes.

In an embodiment, a memory interface module provides interfacing between a host processor and multiple flash memories with varying protocols. The memory interface module comprises: a plurality of register files receiving a command from the host processor to control an operation of the plurality of flash memories and a plurality of parallel interfaces; a plurality of operation information registers for executing and storing the command and an operation information; an internal memory receiving and storing host data from the host processor and storing flash data extracted from the plurality of flash memories to transmit to the host processor; a flash interface portion performing a plurality of tasks. The tasks comprises: controlling a control signal to operate the plurality of flash memories; outputting one or more of the command, the operation information, and the host data; and controlling a data bus for enabling data transfer to the plurality of flash memories. The module further includes a finite state machine (FSM) extracting the command and the operation information and controlling the internal memory and the flash interface portion to execute the command. The memory interface module provides a flexibility to control the control signal through a plurality of pre-defined states. The finite state machine (FSM) generates the control signal, such that the plurality of pre-defined states and their transitions being controlled by an user.

Further, an embodiment is a method of interfacing between a host processor and multiple flash memories having varying protocols. The method comprises: receiving a command from the host processor to control an operation of the plurality of flash memories through a plurality of register files; executing and storing the command and an operation information through an operation information register; decoding the command and the operation information through a flash interface portion; and executing an operation according to the decoded command, said memory interface module provides a flexibility to control the control signal through a plurality of pre-defined states. A finite state machine (FSM) is designed to generate the control signal, such that the plurality of pre-defined states and their transitions are controlled by an user.

In an embodiment, an interface between a host processor and a plurality of different types of flash memory comprises: a plurality of input/output pins connected through a glue logic to the plurality of different types of flash memory; and a finite state machine having a plurality of states, the identification of the states and the transition among and between those states being specified by a user of the interface; the finite state machine transitioning between the states to control the operation of the plurality of input/output pins so as to interface with the plurality of different types of flash memory for data exchange.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 3 shows a table depicting the input/output signals for different devices from various vendors;

FIG. 8 shows pin diagrams of the controller module connected to a NOR flash, a SERIAL flash, and a NAND flash.

DETAILED DESCRIPTION OF THE DRAWINGS

A flash memory interface device is provides which is capable of interfacing with various kinds of flash memory devices of varying protocols.

The technique presented herein offers many advantages such as: (1) Area saving due to one set of HW state machines serving for all types of memories against configuration existing today where there are different IPs for serving NOR, Serial and NAND flashes and SDRAMS or other parallel interfaces; (2) New memory types support could be added due to highly flexible approach with minor changes in SW only thereby saving lots of design/verify development time; (3) Reduced pin count as many pins get shared for different memory devices. This can prove to be a great advantage in shrinking technologies where the pad sizes do not reduce in the same proportion as the core; (4) Unique subsystem serving all types of products, the changes would be in SW to enable/disable support of given type of memory, this therefore would reduce complexity of development, integration, verification and STA for different SOC's flash memory interface subsystem; and (5) Reduction in glue would result as there would be no need to multiplex the pins for different types of memories.

Figure 1:
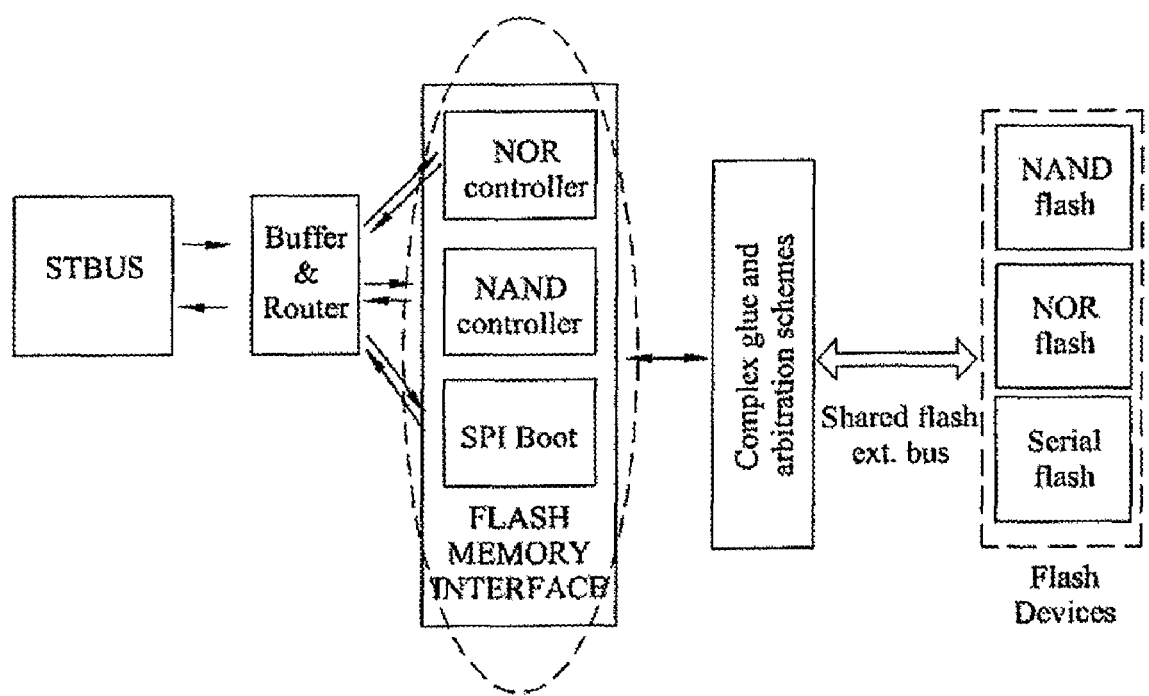
FIG. 1 illustrates a conventional structure for a flash memory interface system interacting with NAND, NOR and SERIAL flash memories.
Figure 2:
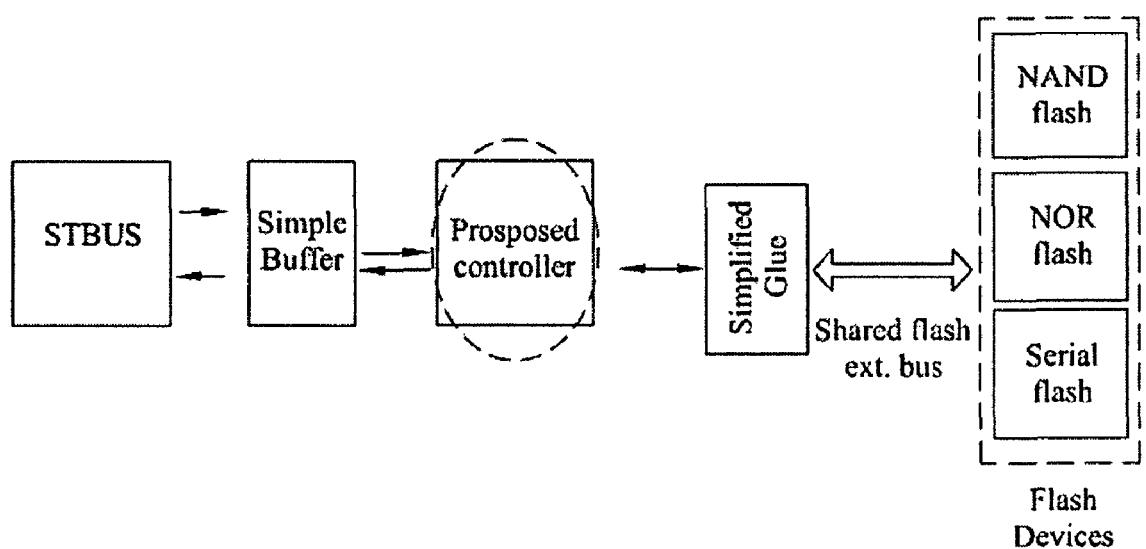
FIG. 2 illustrates a proposed structure of flash memory interface according to an embodiment.

FIG. 2 illustrates a proposed structure of flash memory interface according to an embodiment. In the proposed structure the three modules, as present in the conventional structure, are replaced by one flexible memory module. This arrangement obviates the need for multiplexing the pins at the output, thereby reducing the glue logic and improving timing. This single module also offers more flexibility as compared to conventional structures, which have three individual modules.

The memory interface module implemented through the controller shown in FIG. 2 includes a plurality of register files which receive commands from the host processor to control an operation of the plurality of flash memories and a plurality of parallel interfaces. A plurality of operation information registers are included in the controller for executing and storing the command and an operation information. An internal memory receives and stores host data from the host processor and stores flash data extracted from the plurality of flash memories to transmit to the host processor. A flash interface portion of the controller performs a plurality of tasks. These tasks comprise: controlling a control signal to operate the plurality of flash memories; outputting one or more of commands, operation information, and host data; and controlling a data bus for enabling data transfer to the plurality of flash memories. Operation of the controller is controlled via a finite state machine (FSM) which extracts the command and the operation information and controls the internal memory and the flash interface portion to execute the command. The memory interface module provides a flexibility to control the control signal through a plurality of pre-defined states. The finite state machine (FSM) generates the control signal, such that the plurality of pre-defined states and their transitions are being controlled by a user.

The internal memory comprises a booting memory for storing a booting code to boot a system, one of a buffer, and a register file for storing the host data and the flash data, and an ECC checker.

The plurality of register files comprise: an address register for storing an address of a memory read/write location, a command register for storing device commands for a particular memory being interfaced, and a timing register for storing one or more of a setup time information, a hold time information, and a memory device timing information. The plurality of register files further comprise a status register for storing an operation status information of the command, and an execution result of the command.

In operation, the controller functions as follows to interface between a host processor and a plurality of flash memories through a memory interface module. Again, it will be noted that the plurality of flash memories obey a plurality of different protocols. A command is received from the host processor to control an operation of the plurality of flash memories through the plurality of register files. The process executes and stores the command and an operation information through the operation information register. The command and the operation information are decoded through a flash interface portion. An operation is then executed according to the decoded command. In this context, the memory interface module provides a flexibility to control the control signal through a plurality of pre-defined states, wherein the plurality of pre-defined states and their transitions are controlled by a user. The FSM functions to generate the necessary control signal(s).

FIG. 3 shows a table depicting the input/output signals for three devices from three vendors.

Most of the devices from these vendors have the same basic control pins to control various memory operations. For example, chip enable, output enable, latch enable (synch), write enable, clock (synch) to control the device bus operations.

The following example explains the proposed embodiment in the context of NOR flashes. Different embodiments for other types of memory devices can also be proposed.

Without loss of generality let us consider the NOR flashes available from three vendors: INTEL, AMD and ST. Each vendor memory provides ASYNCH and SYNCH modes. There are a number of commands available for each one of them for READ, PROGRAM, ERASE, PROGRAM SUSPEND, BLOCK PROTECT etc. The numbers of bus cycles required for these various operations as well as the commands are different for different vendor devices.

However, the (dynamic) input/output signals for all three of them are very similar.

The proposed idea is to provide the user (software) the flexibility to control these control signals through some pre-defined states.

These control signals will be generated from the controller through a state machine. The states of this state machine and the transitions between them could be controlled by the user.

The section below explains the idea in detail.

Figure 4:
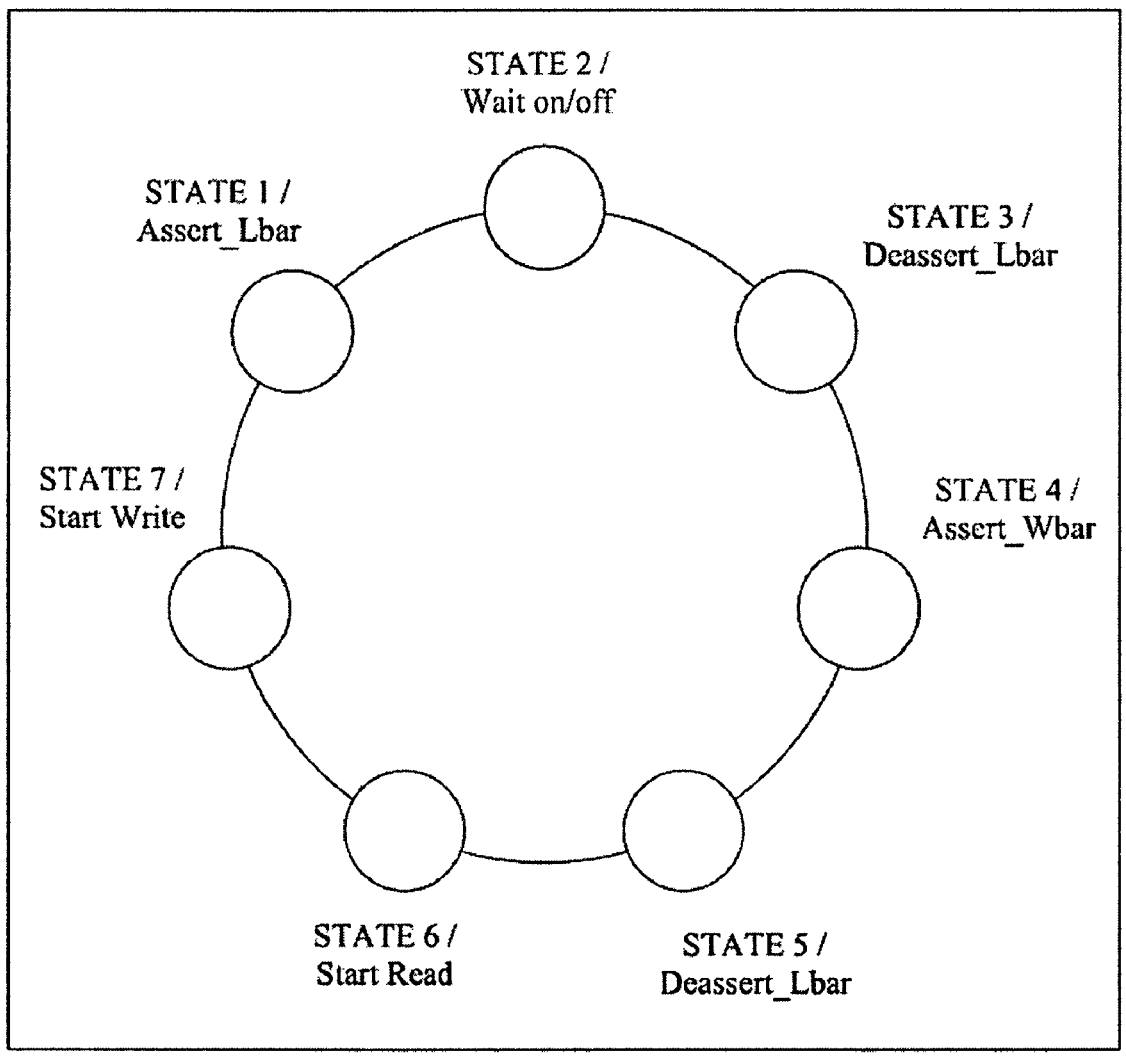
FIG. 4 shows various states of a finite state machine (FSM) according to an embodiment.

A NOR-controller that drives the control signals of the flash device usually consists of a finite state machine (FSM). Let us say that the FSM is made up of the following states as shown in FIG. 4.

These states drive the device control signals. The state STATE 7 (start write), for example, prepares the device for a write operation by carrying out the following operations: 1. Provides a valid address at the address pins; 2. Asserts the chip enable signal; 3. Deasserts the output enable signal; 4. Provides a valid command/data at the data pins.

The rest of the states also carry out such basic operations as is evident from their names. When the transitions between these states are defined, the FSM (Moore machine) would be complete.

Now, let us say that we have a collection of n such states. Some of these states are as basic as the ones mentioned above and few others are made from the combination of one or more of these basic states. If we ensure that any device with these control signals can be controlled by a proper combination and sequencing of these states, then we can provide unlimited flexibility to the user by giving him power to control the transition between these states.

The transition between these states can be controlled by the user (software SW) via a set of instruction-operand pair provided. Each of these instruction-operand pair may be used to control one or more control signals of the memory devices. The operand might contain added information required to complete the command for example the address for reads/writes, or information about the register which contains this information. Similarly the information about data, timing values, device commands etc. might be contained in the operand or register file(s). The sequences of such instruction-operand pairs are executed by the FSM, thereby implementing the desired protocol required by the memory device being interfaced. Different sequences of these instructions along with a variety of data/address/device command will provide valid control signal sequences for different memory devices.

Figure 5:
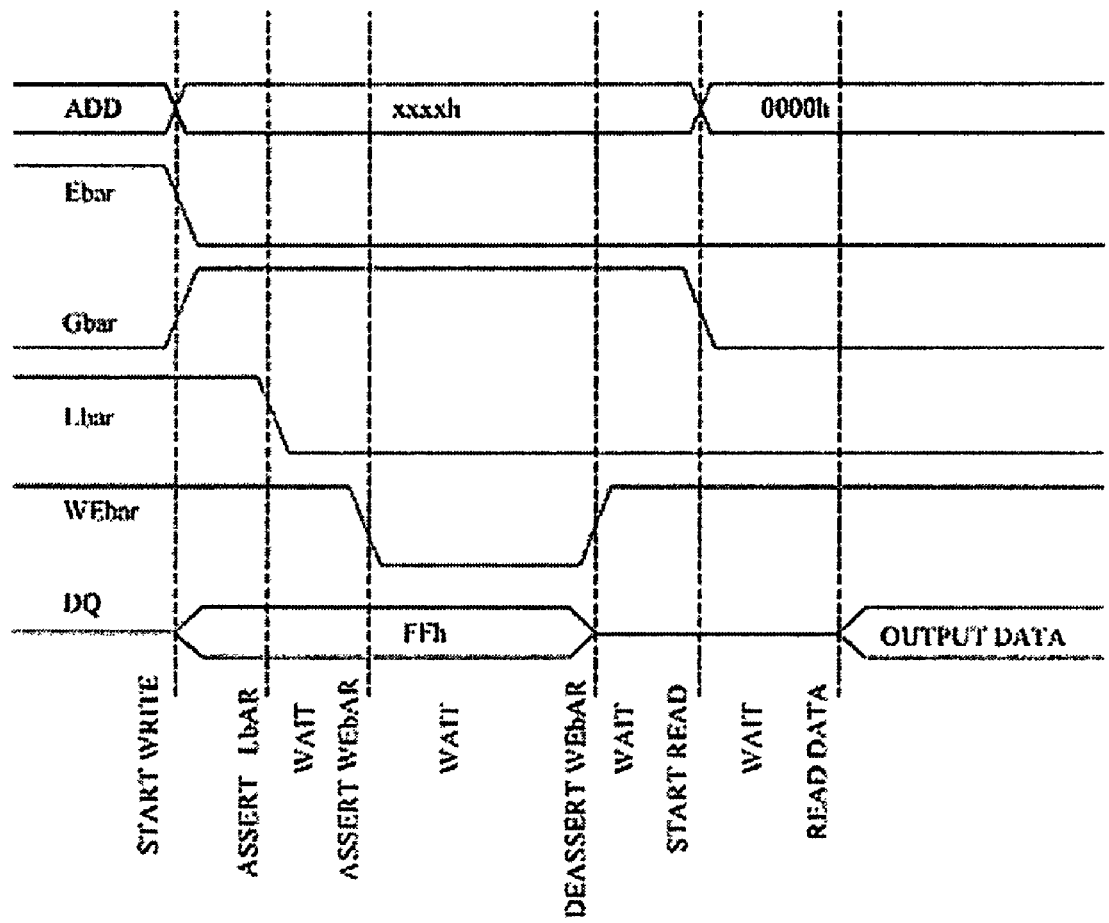
FIG. 5 illustrates a timing diagram to show how the NOR controller can be programmed for an asynchronous read operation for a flash memory.

FIG. 5 illustrates a timing diagram to show how the NOR controller can be programmed for an asynchronous read operation for a flash memory in an embodiment.

A set of example states and their transitions and the resulting waveform would be as shown in the FIG. 5.

Figure 6:
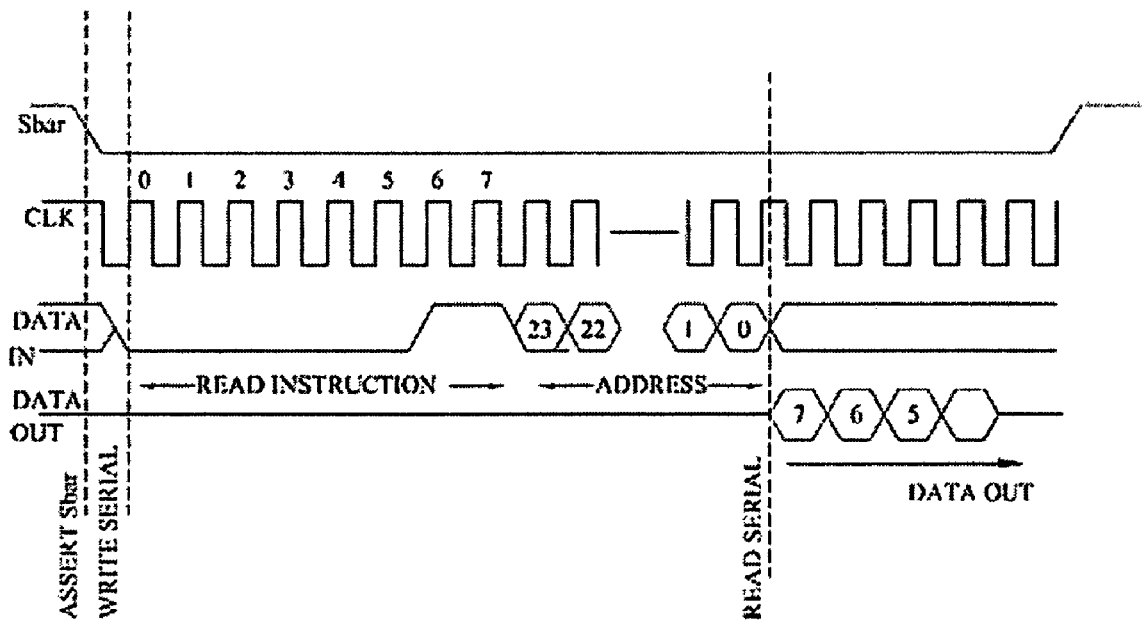
FIG. 6 illustrates a timing diagram of an example of read data bytes from a SERIAL flash.

FIG. 6 illustrates a timing diagram of an example of read data bytes from a SERIAL flash.

A similar scheme would work for serial flashes as well. In order to interface with a variety of memory devices, a set of generic states will have to be defined. Each of these states will be valid for one or more of these memory devices.

Since most of the memory operations require repetition of certain control signal sequences, an instruction-operand pair to repeat a particular sequence of states might ease the task of repeating certain instructions a number of times in the sequence. The information about the sequence of states to be repeated and the number of times it is to be repeated may be contained in the operand or register files(s).

FIG. 6 shows the read waveform.

Figure 7:
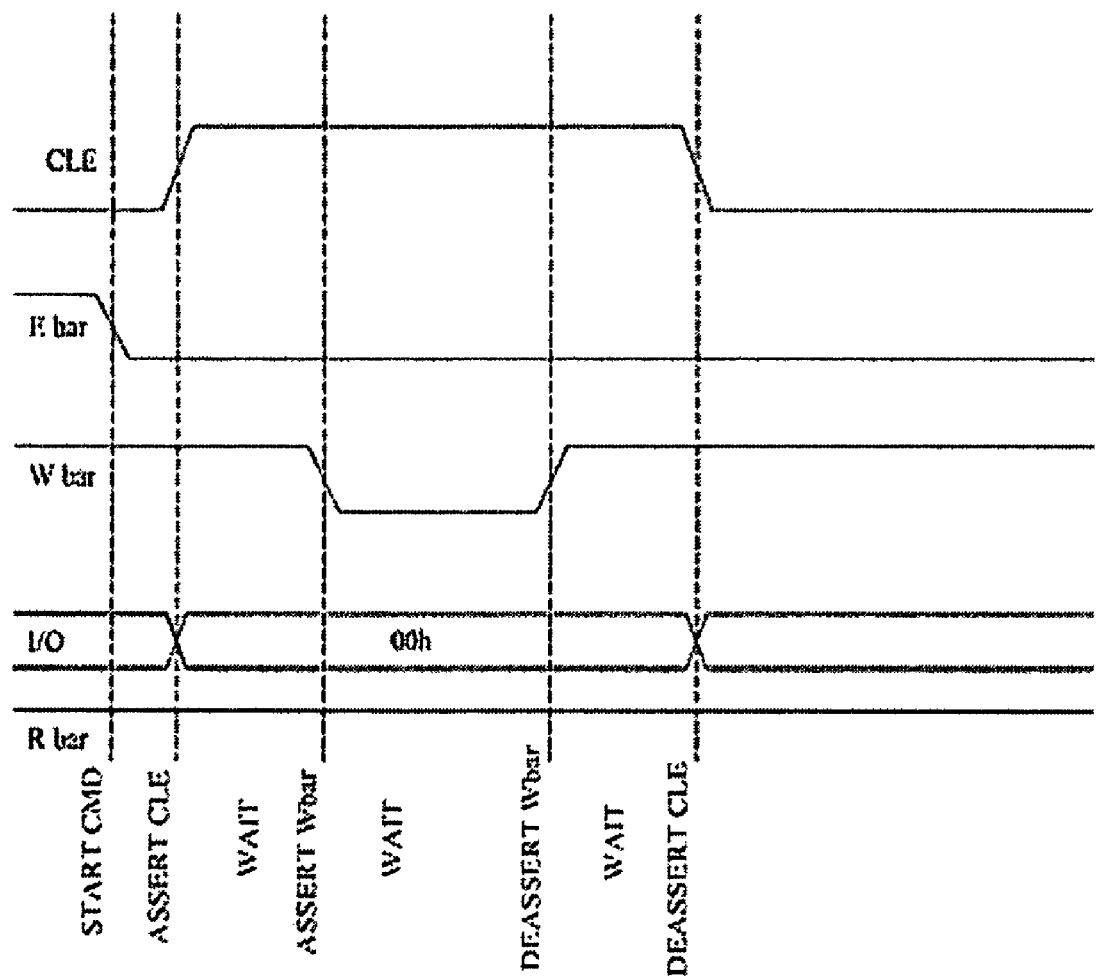
FIG. 7 illustrates a timing diagram of an example of a command cycle with its waveform in a NAND flash.

FIG. 7 illustrates a timing diagram of an example of a command cycle with its waveform in a NAND flash.

The set of instructions shown in FIGS. 5, 6 and 7 are explained in three different embodiments for NAND, NOR, SERIAL. Different embodiments can also exist for different devices and protocols.

NAND flashes have similar pins as compared to NOR flashes. The CE (chip enable) pin and the WE (write enable) pin are same in both the flashes (with same/similar functionality). The NAND flashes have only one input output bus for all data and address I/Os. The pin OE-bar (output enable) can function as the ALE (address latch enable) pin and the Lbar pin can function as the CLE (command latch enable) pin. We would, however need an extra port for the R-bar (read enable) pin of the NAND flash.

FIG. 8 shows pin diagrams of the controller module (FIG. 2) connected to a NOR flash, a SERIAL flash, and a NAND flash.

As shown in FIG. 8 the same set of states as well as I/O pins of the controller might be used to interface with a variety of memory devices. This scheme may be applied to SDRAMs or other parallel interfaces by bringing about a few modifications/additions to the states/instructions defined as might be obvious to those skilled in the art Other Possible Enhancements Another enhancement that can be done to improve the throughput requirements is to have a "PING-PONG" structure for the register file(s). This means that we have two sets of register file(s) instead of one. And while the controller is executing states from one set of register files, the user (software SW) can program the other set of register, thereby having smooth uninterrupted transactions at the flash memory end. This would increase the throughput of the memory especially for transactions requiring large number of state changes.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory interface module for interfacing between a host processor and a plurality of flash memories, the plurality of flash memories obeying a plurality of different protocols, said memory interface module comprising:
a flash interface configured to be coupled between a host processor connection to the memory interface module and each of the plurality of flash memories, the flash interface supplying driving device control signals;
a plurality of register files including: an address register configured to store an address of a memory read/write location in a particular one of the plurality of flash memories and a command register configured to store device commands to control operation of that particular one of the plurality of flash memories;
a plurality of operation information registers configured to store a command received from the host processor to control flash memory operation;
a finite state machine (FSM) configured to extract the command from the operation information registers, the FSM including a plurality of states relating to driving device control signals with respect to each of the plurality of flash memories, there being a sequence of states for interfacing with each of the plurality of flash memories, wherein transitions between the plurality of states in the sequence of states are controlled by software in the form of instruction-operand pairs executed in response to the extracted command, each instruction-operand pair controlling the generation of the device control signals supplied by the flash interface, wherein the operand of certain instruction-operand pairs identifies the address register within the register files which stores the memory read/write location address, and wherein the operand of certain other instruction-operand pairs identifies the command register within the register files which stores the device command.

2. The memory interface module of claim 1 wherein the plurality of register files further includes a timing register configured to store timing information for accessing that particular one of the plurality of flash memories, and wherein the operand of other instruction-operand pairs identifies the timing register within the register files which stores the timing information.

3. The memory interface module of claim 1, wherein the plurality of flash memories is selected from a group consisting of flash memories, SDRAMs, and parallel interfaces.

4. The memory interface module of claim 1, wherein the flash interface includes a plurality of input/output pins connected through a glue logic to the plurality of flash memories; and
wherein the transitions between the plurality of states in the sequence of states of the FSM supplies the driving device control signals on the plurality of input/output pins in accordance with the plurality of different protocols for memory access so as to interface with the plurality of flash memories.

5. The memory interface module of claim 4 wherein the plurality of input/output pins includes a first input/output pin connected through the glue logic to both a first type flash memory and a second type flash memory, the FSM configured to control the first input/output pin to operate in a first mode for interfacing with the first type flash memory in accordance with its protocol for memory access and a second mode for interfacing with the second type flash memory in accordance with its protocol for memory access.

6. The memory interface module of claim 4 wherein the plurality of flash memories comprise a first type flash memory and a second type flash memory, and wherein the first type flash memory utilizes a first protocol for memory access and the second type flash memory utilizes a second protocol for memory access, the FSM configured to control the first input/output pin to operate in accordance with the first protocol for memory access for interfacing with the first type flash memory and in accordance with the second protocol for memory access for interfacing with the second type flash memory.

7. The memory interface module of claim 1 wherein the plurality of flash memories comprise a first type flash memory and a second type flash memory, and wherein the first type flash memory utilizes a first control signal sequence in accordance with its protocol for memory access and the second type flash memory utilizes a second control signal sequence in accordance with its protocol for memory access, the transitions between the plurality of states in the sequence of states implemented by the FSM causing the flash interface to effectuate the first control signal sequence when interfacing with the first type flash memory and effectuate the second control signal sequence when interfacing with the second type flash memory.

8. The memory interface module of claim 1 wherein the plurality of memories comprise a first type flash memory and a second type flash memory, and wherein a first sequence of states implemented by the FSM is used to access the first type flash memory in accordance with a first protocol for memory access and a second sequence of states implemented by the FSM is used to access the second type flash memory in accordance with a second protocol for memory access.

9. The memory interface module of claim 1 wherein the instruction-operand pairs include a repeat instruction-operand pair which, when executed by the FSM, repeats a state relating to a driving device control signal with respect to one of the plurality of flash memories.

10. The memory interface module of claim 9 further including an internal memory buffer configured to store data in response to repeated execution by the FSM in accordance with the repeat instruction-operand pair.

11. A memory interface module for interfacing between a host processor and a plurality of flash memories, the plurality of flash memories obeying a plurality of different protocols, said memory interface module comprising:
a flash interface configured to be coupled between a host processor connection to the memory interface module and each of the plurality of flash memories, the flash interface supplying driving device control signals;
a first plurality of register files including: a first address register configured to store an address of a memory read/write location in a first one of the plurality of flash memories and a first command register configured to store device commands to control operation of that first one of the plurality of flash memories;
a second plurality of register files including: a second address register configured to store an address of a memory read/write location in a second one of the plurality of flash memories and a second command register configured to store device commands to control operation of that second one of the plurality of flash memories;
a plurality of operation information registers configured to store a command received from the host processor to control flash memory operation;
a finite state machine (FSM) configured to extract the command from the operation information registers, the FSM including a plurality of states relating to driving device control signals with respect to each of the plurality of flash memories, there being a sequence of states for interfacing with each of the plurality of flash memories, wherein transitions between the plurality of states in the sequence of states are controlled by software in the form of instruction-operand pairs executed in response to the extracted command, each instruction-operand pair controlling the generation of the device control signals supplied by the flash interface, wherein the operand of certain instruction-operand pairs identifies the address register within the register files which stores the memory read/write location address, and wherein the operand of certain other instruction-operand pairs identifies the command register within the register files which stores the device command; and wherein one of the first and second register files is configured to be programmed with address and device commands while the address and device commands stored in the other of the first and second register files are being accessed by the finite state machine in connection with driving device control signals.

* * * * *